United States Patent
Kanno

(10) Patent No.: US 7,629,802 B2
(45) Date of Patent: Dec. 8, 2009

(54) SEMICONDUCTOR DEVICE INCLUDING FUSE AND METHOD FOR TESTING THE SAME CAPABLE OF SUPPRESSING ERRONEOUS DETERMINATION

(75) Inventor: Kiyoshi Kanno, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 12/202,903

(22) Filed: Sep. 2, 2008

(65) Prior Publication Data
US 2009/0001994 A1 Jan. 1, 2009

Related U.S. Application Data

(62) Division of application No. 11/514,235, filed on Sep. 1, 2006, now Pat. No. 7,474,106.

(30) Foreign Application Priority Data
Sep. 2, 2005 (JP) ............... 2005-255043

(51) Int. Cl.
*G01R 27/00* (2006.01)
(52) U.S. Cl. .................. 324/713; 324/705
(58) Field of Classification Search .......... 324/157, 324/550, 713, 705, 765; 257/209, 529; 438/14; 365/225.7
See application file for complete search history.

(56) References Cited

U.S. PATENT DOCUMENTS

| | | | |
|---|---|---|---|
| 6,307,801 B1 * | 10/2001 | Ogawa et al. | 365/226 |
| 2003/0006466 A1 * | 1/2003 | Kimura | 257/369 |
| 2003/0090274 A1 | 5/2003 | Kitade | |

FOREIGN PATENT DOCUMENTS

JP 1062477 A 3/1998

* cited by examiner

*Primary Examiner*—Vincent Q Nguyen
(74) *Attorney, Agent, or Firm*—Sughrue Mion, PLLC

(57) ABSTRACT

Provided is a semiconductor device including a determination circuit adapted to determine whether a fuse is in a connection or disconnection state. The semiconductor device includes a first and second power supply terminals, a measuring terminal, and at least one trimming detection circuit connected between the measuring terminal and one of the first and second power supply terminals. The trimming detection circuit is constructed by a current supplying element, a series arrangement of a fuse and a switch element, and the determination circuit. The current supplying element and series arrangement are connected in series between the measuring terminal and the one of the first and second power supply terminals. The determination circuit has an input connected to a node between the current supplying element and series arrangement. A voltage at the other of the first and second power supply terminals is applied to the measuring terminal in a normal mode.

12 Claims, 15 Drawing Sheets

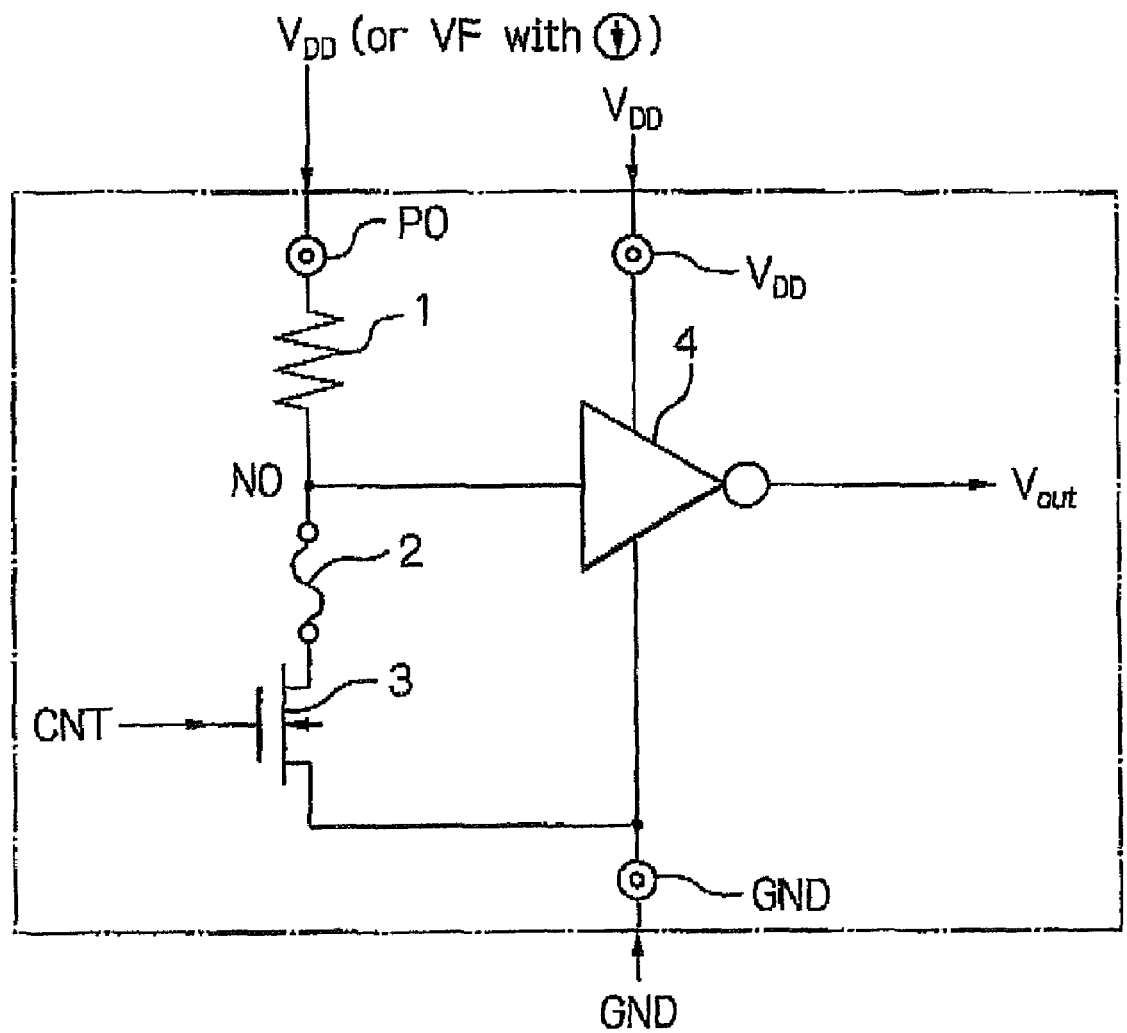

| Fig. 6A |
| Fig. 6B |

SEMICONDUCTOR DEVICE INCLUDING FUSE AND METHOD FOR TESTING THE SAME CAPABLE OF SUPPRESSING ERRONEOUS DETERMINATION

This is a divisional of application Ser. No. 11/514,235 filed Sep. 1, 2006 now U.S. Pat. No. 7,474,106. The entire disclosure(s) of the prior application(s), application Ser. No.(s) 11/514,235 is hereby incorporated by reference.

BACKGROUND OF THE INVENTION

1. Field of the Invention

The present invention relates to a semiconductor device including at least one trimming detection circuit formed by a fuse as a trimming element and a method for testing the trimming detection circuit.

2. Description of the Related Art

In order to set a function or operating parameters of an electronic circuit and fine-adjust the output voltage of a reference voltage, a trimming detection circuit formed by an electrically-trimmed trimming element showing logic "1" or "0" may be incorporated into a semiconductor device. Such a trimming element is a laser fuse trimmed by laser, a Zener diode trimmed by Zener zap or a so-called electric (E)-fuse trimmed by supplying a blowing current thereto.

In the above-mentioned trimming detection circuit, an incomplete disconnection state may occur. For example, after a fuse is trimmed by laser, a melted remainder of the fuse may be present in the proximity of the trimmed fuse, so that the trimmed fuse would be in an incomplete disconnection state. A semiconductor device including such an incomplete trimming detection circuit should be scrapped before the shipping.

In order to find an incomplete disconnection state fuse, a prior art semiconductor device includes a trimming detection circuit which is constructed by a series arrangement of a resistor and a fuse connected between a power supply terminal and a ground terminal, a series arrangement of a testing resistor and an n-channel MOS transistor connected in parallel with the fuse, and a determination circuit formed by an inverter connected to a node between the resistor and the fuse to determine whether the fuse is connected or disconnected (see: JP-10-62477 A).

In a normal mode where a control signal applied to the gate of the MOS transistor is low, the testing resistor is disconnected from the node. On the other hand, in a test mode where the control signal applied to the gate of the MOS transistor is high, the testing resistor is connected to the node. As a result, the determination circuit can determine the incomplete disconnection state fuse as a disconnection state fuse. This will be explained later in detail.

SUMMARY OF THE INVENTION

In the above-described prior art semiconductor device, however, since the resistance value of the incomplete disconnection state fuse actually depends upon the environmental factors such as the voltage at the power supply terminal, the temperature and so on and the time aging deviation thereof, the resistance value of the incomplete disconnection state fuse varies greatly, so that the determination circuit cannot always determine the incomplete disconnection state fuse as a disconnection state.

According to the present invention, in a semiconductor device including first and second power supply terminals, a measuring terminal, and at least one trimming detection circuit connected between the measuring terminal and one of the first and second power supply terminals, the trimming detection circuit is constructed by a current supplying element, a series arrangement of a fuse and a switch element, and a determination circuit. The current supplying element and the series arrangement are connected in series between the measuring terminal and the one of the first and second power supply terminals. The determination circuit has an input connected to a node between the current supplying element and the series arrangement and is adapted to determine whether the fuse is in a connection state or in a disconnection state. A voltage at the other of the first and second power supply terminals is applied to the measuring terminal in a normal mode.

BRIEF DESCRIPTION OF THE DRAWINGS

The present invention will be more clearly understood from the description set forth below, as compared with the prior art, with reference to the accompanying drawings, wherein:

FIG. 2 is a circuit diagram illustrating a first embodiment of the semiconductor device according to the present invention;

DESCRIPTION OF THE PREFERRED EMBODIMENTS

Before the description of the preferred embodiments, a prior art semiconductor device will be explained with reference to FIG. 1 (see: JP-10-62477 A).

Figure 1:
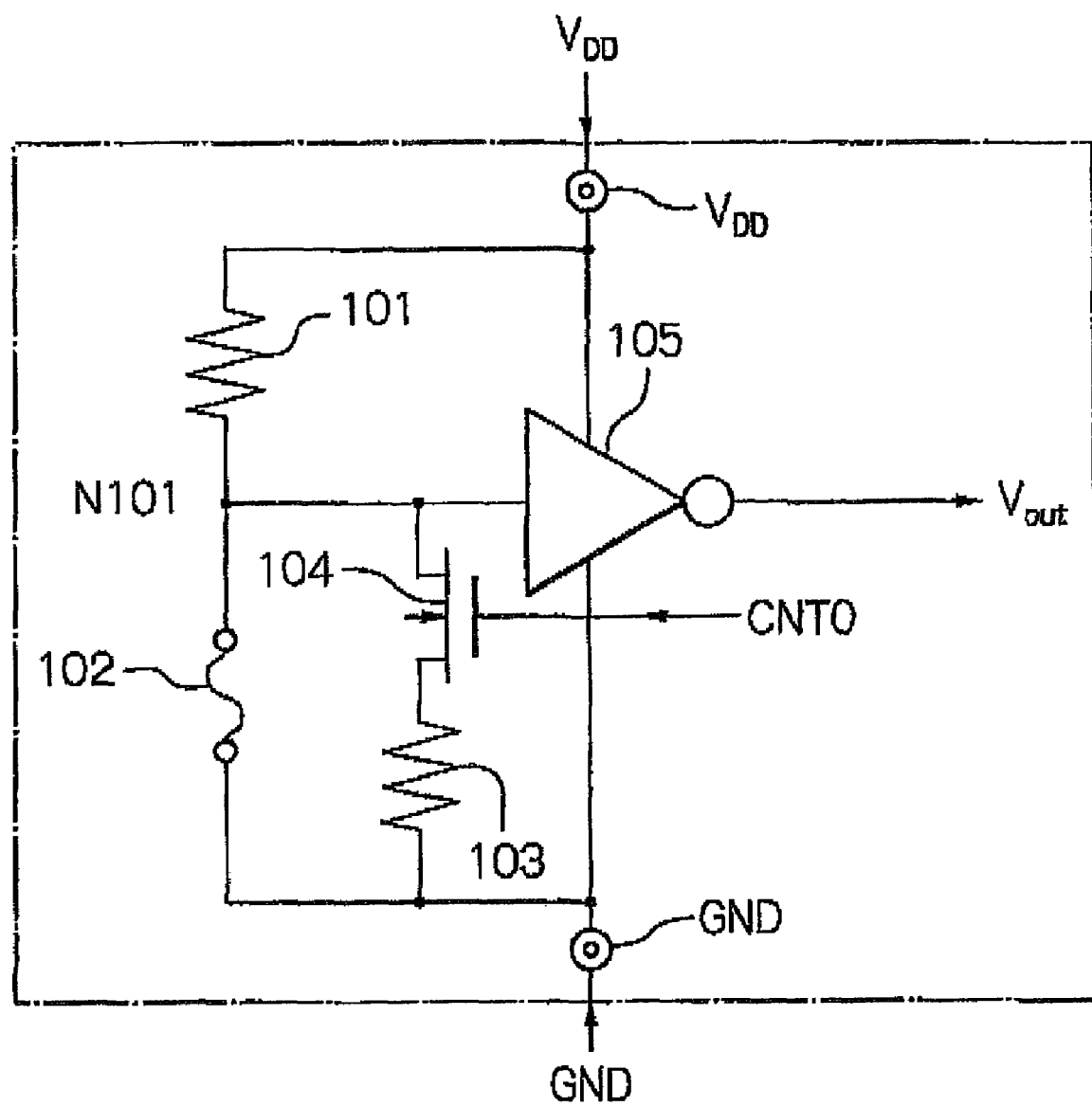
FIG. 1 is a circuit diagram illustrating a prior art semiconductor device including a trimming detection circuit.

In FIG. 1, a trimming detection circuit is constructed by a series arrangement of a resistor 101 and a fuse 102 connected between a power supply terminal $V_{DD}$ and a ground terminal GND. Also, the trimming detection circuit is constructed by a series arrangement of a testing resistor 103 and an n-channel MOS transistor 104 connected in parallel with the fuse 102. Further, the trimming detection circuit is constructed by a determination circuit 105 formed by an inverter connected to a node N101 between the resistor 101 and the fuse 102, to thereby determine whether the fuse 102 is connected or disconnected.

Note that $V_{DD}$ and GND also designate voltages applied to the terminals $V_{DD}$ and GND, respectively.

For example, assume that the resistance values of the resistor 101 and the testing resistor 103 are 2R and 4R, respectively, and the threshold voltage of the determination circuit 105 is $V_{DD}/2$. Also, assume that the resistance value of the fuse 102 is R in a connection state, HZ (high impedance) in a complete disconnection state and about 2R in an incomplete disconnection state.

In a normal mode where a control signal CNT0 applied to the gate of the MOS transistor 104 is low, the testing resistor 103 is disconnected from the node N101. Therefore, if the fuse 102 is in a connection state, the voltage at the node N101 is $(1/3) \cdot V_{DD}$, so that the output $V_{out}$ of the determination circuit 103 is "1" (high level). Also, if the fuse 102 is in a complete disconnection state, the voltage at the node N101 is $V_{DD}$, so that the output $V_{out}$ of the determination circuit 105 is "0" (low level). Further, if the fuse 102 is in an incomplete disconnection state, the voltage at the node N101 is about $(1/2) \cdot V_{DD}$, so that the output $V_{out}$ of the determination circuit 105 is unstable.

On the other hand, in a test mode where the control signal CNT0 applied to the gate of the MOS transistor 104 is high, the testing resistor 103 is connected to the node N101. Therefore, if the fuse 102 is in a connection state, the voltage at the node N101 is $(1/7) \cdot V_{DD}$, so that the output $V_{out}$ of the determination circuit 103 is "1" (high level). Also, if the fuse 102 is in a complete disconnection state, the voltage at the node N101 is $(2/3) \cdot V_{DD}$, so that the output $V_{out}$ of the determination circuit 105 is "0" (low level). Further, if the fuse 102 is in an incomplete disconnection state, the voltage at the node N101 is about $(1/5) \cdot V_{DD}$, so that the output $V_{out}$ of the determination circuit 105 is "1" (high level). Thus, the determination circuit 105 can determine the incomplete disconnection state fuse 102 as a disconnection state fuse.

In the semiconductor device of FIG. 1, however, since the resistance value of the incomplete disconnection state fuse 102 actually depends upon the environmental factors such as the voltage at the power supply terminal $V_{DD}$, the temperature and so on and the time aging deviation thereof, the resistance value of the incomplete disconnection state fuse 102 greatly varies, so that the determination circuit 105 cannot always determine the incomplete disconnection state fuse 102 as a disconnection state.

In FIG. 2, which illustrates a first embodiment of the semiconductor device according to the present invention, this semiconductor device includes one trimming detection circuit which is constructed by a resistor 1 and a series arrangement of a fuse 2 and an n-channel MOS transistor 3 connected in series between a measuring terminal (pad) PO and a ground terminal (pad) GND. Also, the trimming detection circuit is constructed by a determination circuit 4 formed by an inverter connected to a node N0 between the resistor 1 and the series arrangement of the fuse 3 and the n-channel MOS transistor 3, to thereby determine whether the fuse 2 is connected or disconnected. In this case, the inverter of the determination circuit 4 has a threshold voltage of $V_{DD}/2$, for example.

In a normal mode, a power supply voltage $V_{DD}$ is applied to the measuring terminal (pad) PO and a control signal CNT applied to the gate of the MOS transistor 3 is high, the fuse 2 is connected to the ground terminal GND. Therefore, if the fuse 2 is in a connection state, the voltage at the node N0 is GND, so that the output $V_{out}$ of the determination circuit 4 is "1" (high level). Also, if the fuse 2 is in a complete disconnection state, the voltage at the node N0 is $V_{DD}$, so that the output $V_{out}$ of the determination circuit 4 is "0" (low level).

On the other hand, in a test mode, the control signal CNT applied to the gate of the MOS transistor 3 is also high; however, in this case, a current detector of a tester along with a test voltage VF is connected to the measuring terminal PO.

A method for manufacturing the semiconductor device of FIG. 2 is explained next with reference to FIGS. 3A and 3B.

Figure 3A:
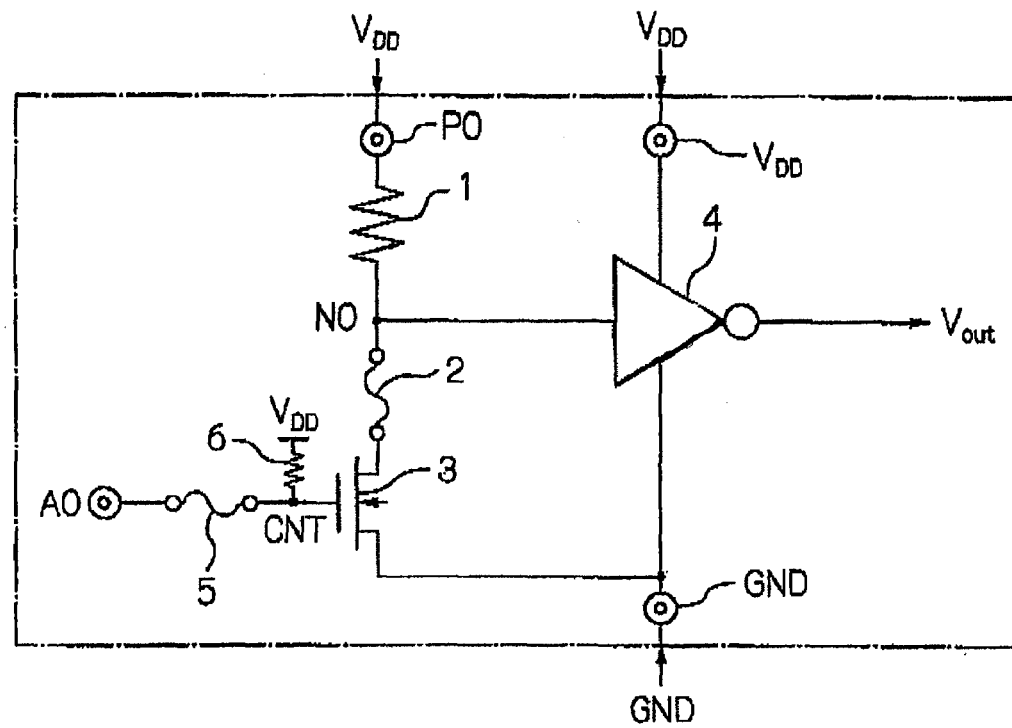
FIGS. 3A and 3B are circuit diagrams for explaining the manufacturing steps of the semiconductor device of FIG. 2.

First, referring to FIG. 3A, the resistor 1, the series arrangement of the fuse 2 and the n-channel MOS transistor 3, and the determination circuit 4 are formed in a semiconductor substrate (not shown). Also, the gate of the MOS transistor 3 is connected via another fuse 5 to a terminal (pad) AO which is not used for testing the trimming detection circuit. Further, the gate of the MOS transistor 3 is connected via a pull-up resistor 6 to the power supply terminal (pad) $V_{DD}$. Therefore, after the fuse 5 is disconnected by a trimming process, the control signal CNT is always high to turn ON the MOS transistor 3.

Figure 3B:
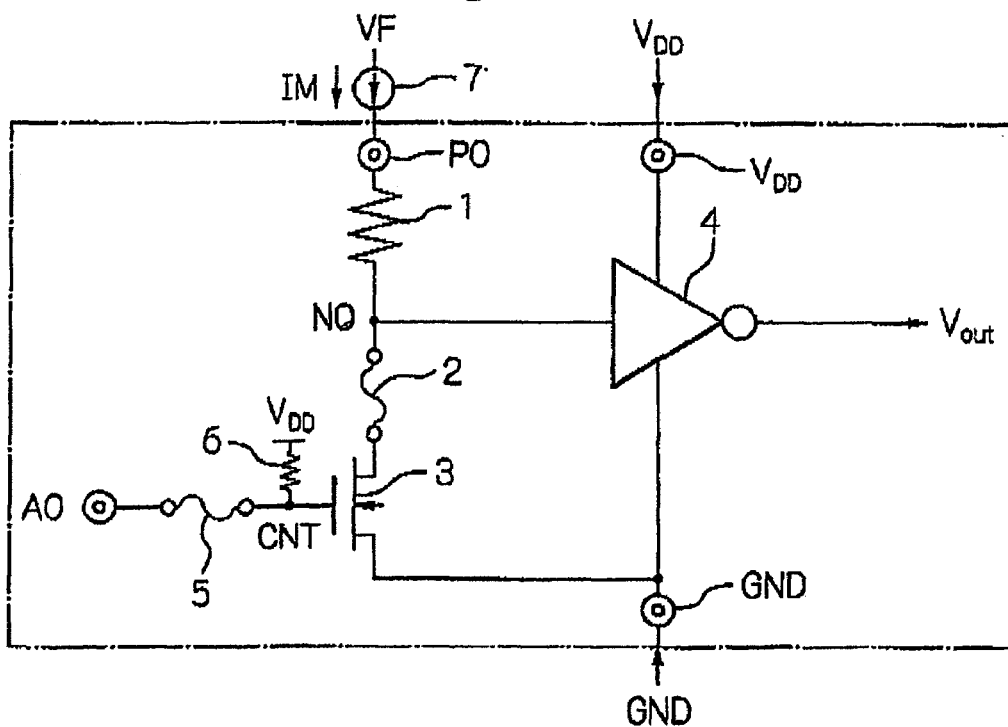

Next, referring to FIG. 3B, a current detector 7 of a tester to which a test voltage VF is applied is connected to the measuring terminal (pad) PO using a probe (not shown), and the tester is also connected to other pads including the power supply terminal (pad) $V_{DD}$, the ground terminal (pad) GND, the address signal terminal (pad) AO and so on. In this case, the tester also can supply a blowing current via a fuse blowing circuit (not shown) to the fuse 2, so that the fuse 2 can be melted by the electromigration phenomenon.

Figure 4:
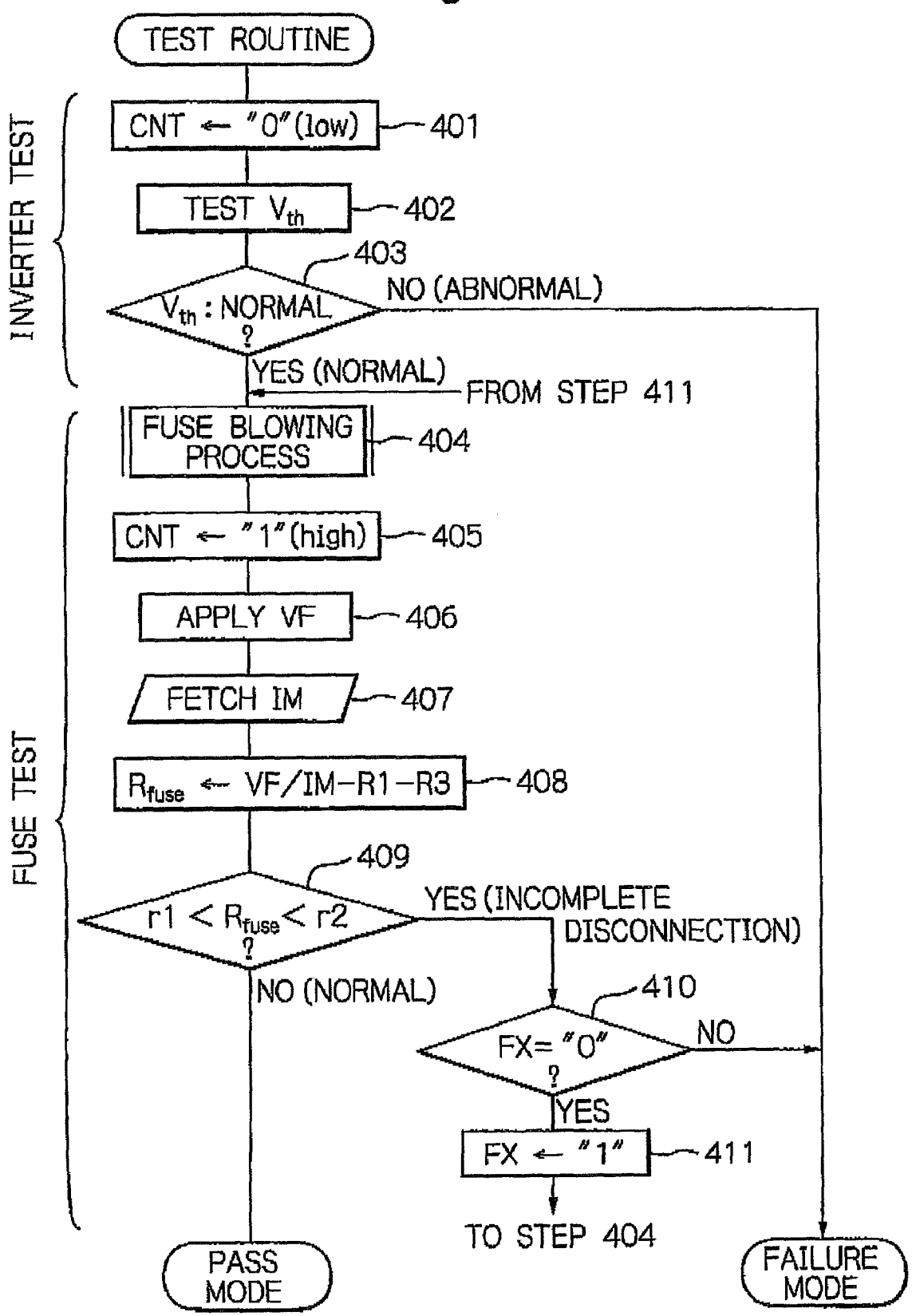
FIG. 4 is a flowchart for testing the semiconductor device of FIG. 3B.

Whether the fuse 2 is in a connection state, in a complete disconnection state or in an incomplete disconnection state and whether the determination circuit (inverter) 4 is normal or abnormal are determined by a test routine as shown in FIG. 4. Note that the test routine of FIG. 4 is stored in the memory of the tester.

The routine of FIG. 4 is explained next. In FIG. 4, steps 401 to 403 perform an inverter test upon the determination circuit (inverter) 4, while steps 404 to 411 perform a fuse test upon the fuse 2.

First, at step 401, the control signal CNT is made "0" (low) by causing the voltage at the terminal (pad) AO to be "0" (low). As a result, the voltage at the node N0 is VF.

Next, at step 402, the threshold voltage $V_{th}$ of the determination circuit 4 is detected by changing the voltage VF. In this case, $V_{th}$ is detected when the output $V_{out}$ is switched from high to low or vice versa.

Next, at step 403, it is determined whether or not the detected threshold voltage $V_{th}$ is within a normal range such as from $V_{DD}/2-\alpha$ to $V_{DD}/2+\alpha$ where $\alpha$ is a definite value. As a result, only when the detected threshold voltage $V_{th}$ is within the normal range, does the control proceed to step 404. Otherwise, the control proceeds to a failure mode which would scrap the device.

Thus, according to steps 401 to 403, the testing operation of the determination circuit (inverter) 4 can be carried out regardless of whether the fuse 2 is connected or disconnected. Therefore, test debug can be effectively carried out before the fuse 2 is disconnected.

Also, at steps 401 to 403, instead of changing the voltage VF, $V_{DD}-\alpha$ or $V_{DD}+\alpha$ can be applied to the node N0, so that the inverter test operation can be carried out by determining whether $V_{out}$ is "1" (high level) or "0" (low level).

Next, at step 404, as occasion demands, a fuse blowing process is performed upon the fuse 2 by supplying a fuse blowing current to the fuse 2 via a fuse blowing circuit (not shown).

Next, at step 405, the control signal CNT is made "1" (high level) by causing the voltage at the terminal (pad) A0 to be high.

Next, at step 406, a definite voltage is applied as the test voltage VF to the measuring terminal (pad) P0.

Next, at step 407, a current IM is fetched from the current detector 7 flowing through a circuit formed by the resistor 1, the fuse 2 and the MOS transistor 3.

Next, at step 408, a resistance value $R_{fuse}$ of the fuse 2 is calculated by $$R_{fuse} \leftarrow VF/IM - R1 - R3$$

where R1 is a resistance value of the resistor 1; and
R3 is an ON-resistance value of the MOS transistor 3. Note that, generally, since R3<<R1, the ON-resistance value R3 can be omitted. In this case, since the resistance value R1 of the resistor 1 is determined in advance, the resistance value $R_{fuse}$ can be determined.

Next, at step 409, it is determined whether or not the resistance value $R_{fuse}$ of the fuse 2 is within a normal range defined by values r1 and r2 (r1<r2). That is, if $R_{fuse} \leq r1$, the fuse 2 is deemed to be in a connection state, and if $R_{fuse} \geq r2$, the fuse 2 is deemed to be in a complete disconnection state. Therefore, the control proceeds to a pass mode. On the other hand, if $r1 < R_{fuse} < r2$, the fuse 2 is deemed to be in an incomplete disconnection state, so that the control returns via steps 410 and 411 to step 404 which carries out another fuse blowing process. That is, the presence of the flag FX gives one more chance to perform the fuse blowing process upon the incomplete disconnection fuse 2. As a result, if it is again deemed that $r1 < R_{fuse} < r2$ is satisfied, the control proceed via steps 409 and 410 to a failure mode which would scrap the device.

Note that steps 410 and 411 can be omitted; in this case, if the determination at step 409 is affirmative ($r1 < R_{fuse} < r2$), the control always proceeds to the failure mode.

In the pass mode, a fuse blowing process is performed upon the fuse 5 using a fuse blowing circuit (not shown), so that the control signal CNT can always be made high by the pull-up resistor 6. Thus, the MOS transistor 3 can always be turned ON. Also, the tester along with the probes is removed from the device, thus obtaining the semiconductor device of FIG. 2.

In FIG. 4, steps 401 to 403 can be carried out after steps 404 to 411 are carried out.

Figure 5:
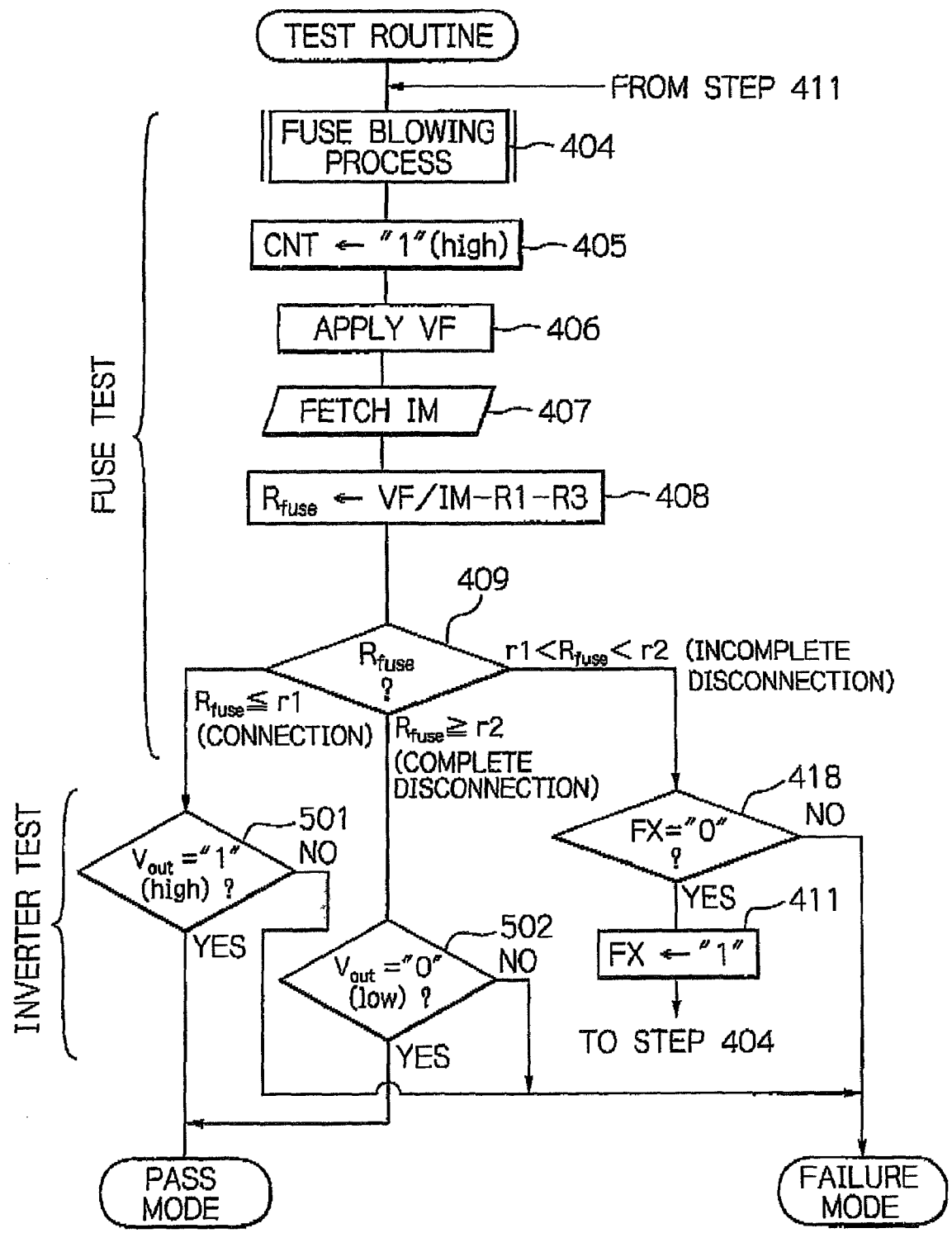
FIG. 5 and FIGS. 6A and 6B are modifications of the flowchart of FIG. 4.

In FIG. 5, which is a modification of the flowchart of FIG. 4, steps 501 and 502 are provided instead of steps 401, 402 and 403 of FIG. 4.

That is, at step 409, if the resistance value $R_{fuse}$ of the fuse 2 is determined to satisfy $R_{fuse} \leq r1$, the control proceeds to step 501 which determines whether the output $V_{out}$ of the determination circuit 4 is "1" (high level). In this case, since the fuse 2 is in a connection state, the output $V_{out}$ of the determination circuit 4 is expected to be "1" (high level). Therefore, if $V_{out}$="0" (low level), the determination circuit 4 would be defective, so that the control proceeds to the failure mode. Otherwise, the control proceeds to the pass mode.

Also, at step 409, if the resistance value $R_{fuse}$ of the fuse 2 is determined to satisfy $R_{fuse} \geq r2$, the control proceeds to step 502 which determines whether the output $V_{out}$ of the determination circuit 4 is "0" (low level). In this case, since the fuse 2 is in a complete disconnection state, the output $V_{out}$ of the determination circuit 4 is expected to be "0" (low level). Therefore, if $V_{out}$"1" (high level), the determination circuit 4 would be defective, so that the control proceeds to the failure mode. Otherwise, the control proceeds to the pass mode.

Figures 6, 6A:
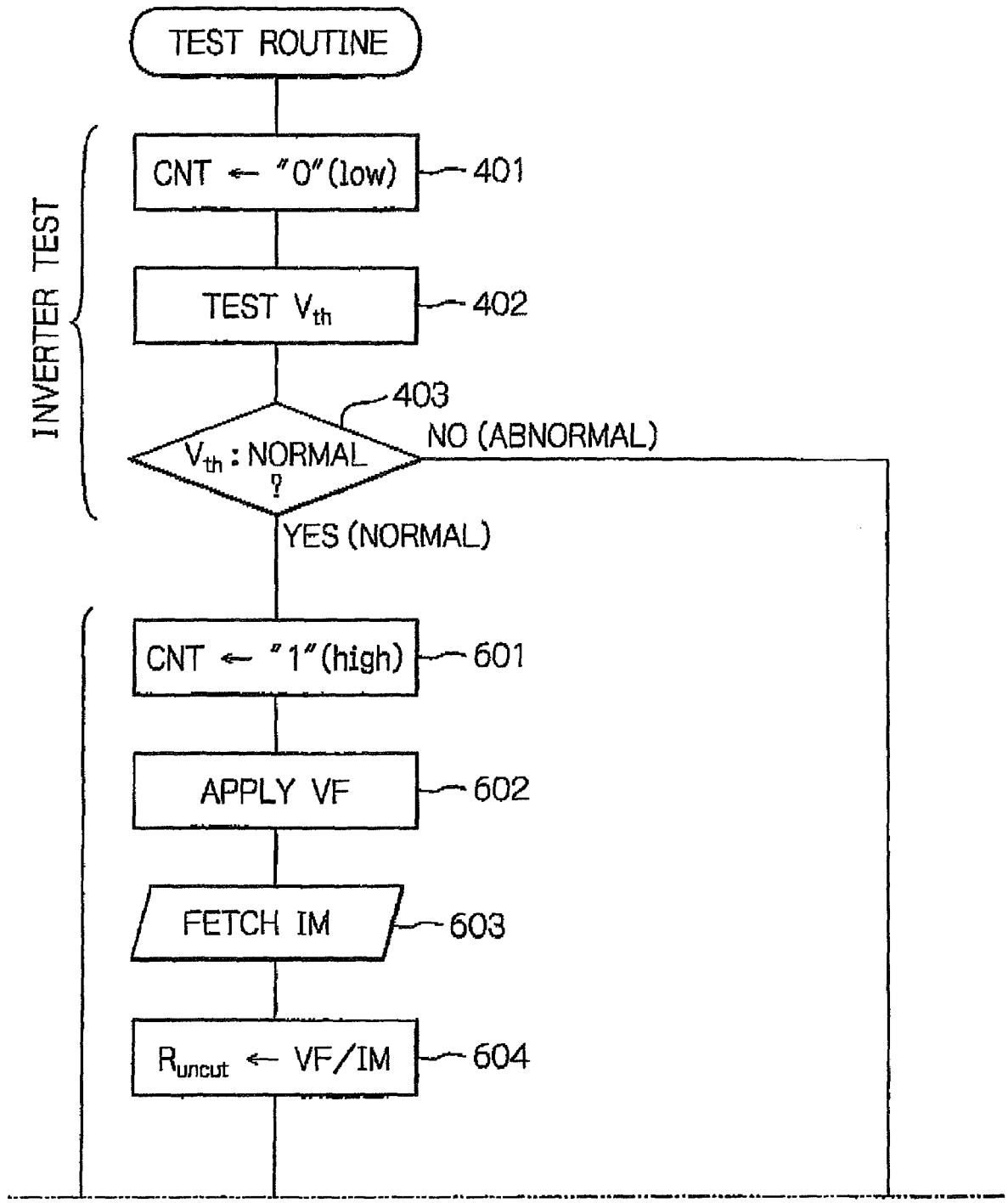
Figure 6B:
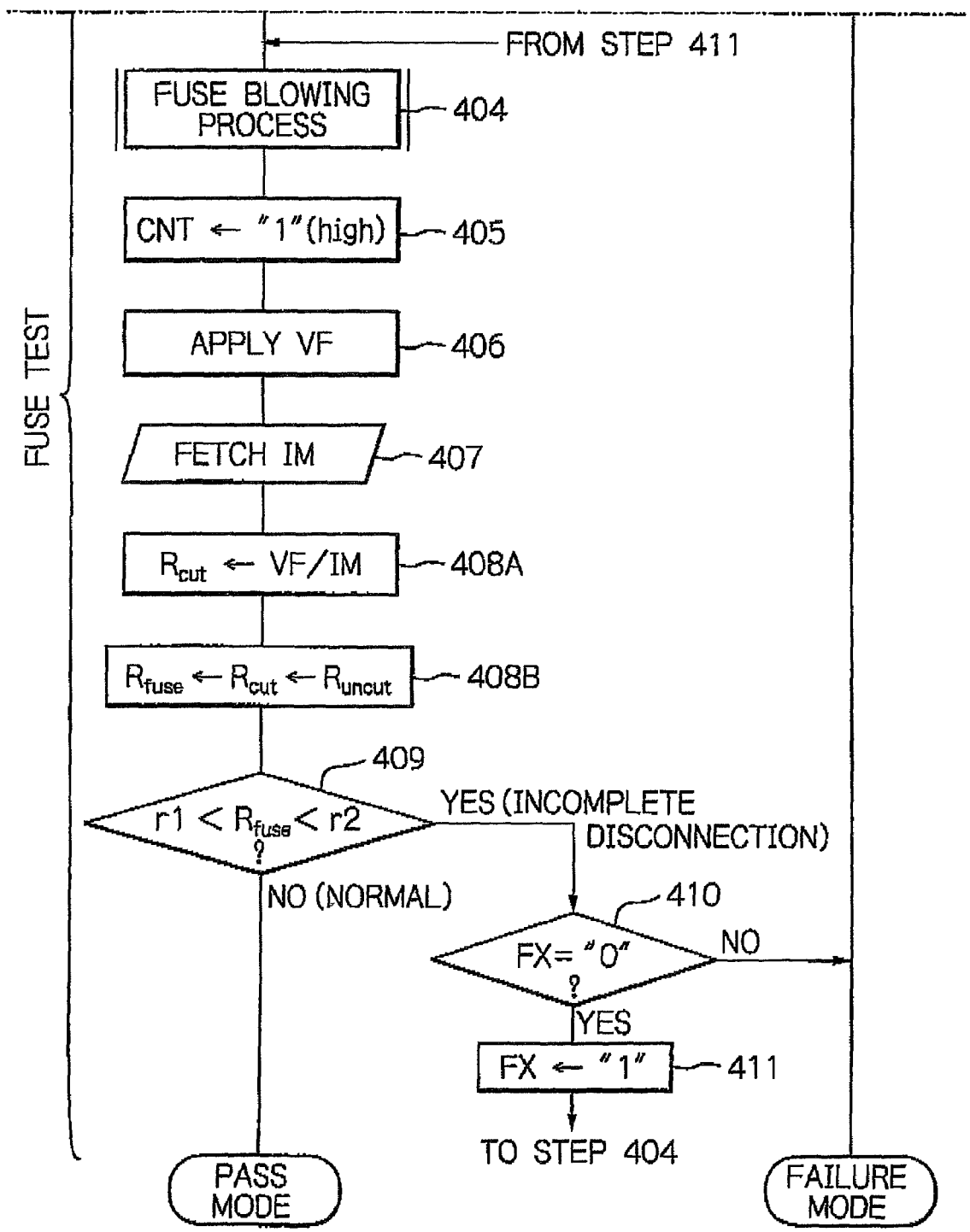

In FIG. 6, which is another modification of the flowchart of FIG. 4, steps 601 to 604 are added to the steps of FIG. 4, and steps 408A and 408B are provided instead of step 408 of FIG. 4.

At steps 601 to 604, a resistance value $R_{uncut}$ of a circuit formed by the resistor 1, the fuse 2 and the MOS transistor 3 before the fuse 2 is disconnected. That is, at step 601, the control signal CNT is made "1" (high level) by causing the voltage at the terminal (pad) AO to be high. Next, at step 602, a definite voltage is applied as the voltage VF to the measuring terminal (pad) PO. Next, at step 603, a current IM is fetched from the current detector 7 flowing through the circuit formed by the resistor 1, the fuse 2 and the MOS transistor 3. Next, at step 604, the resistance value $R_{uncut}$ of this circuit is calculated by $$R_{uncut} \leftarrow VF/IM$$

Also, at steps 404 to 408A, a resistance value $R_{cut}$ of the circuit formed by the resistor 1, the fuse 2 and the MOS transistor 3 after the fuse 2 is disconnected. That is, at step 404, as occasion demands, a fuse blowing process is performed upon the fuse 2 by supplying a fuse blowing current to the fuse 2 via a fuse blowing circuit (not shown). Next, at step 405, the control signal CNT is made "1" (high) by causing the voltage at the terminal (pad) AO to be high. Next, at step 406, a definite voltage is applied as the test voltage VF to the measuring terminal (pad) PO. Next, at step 407, a current IM is fetched from the current detector 7 flowing through the circuit formed by the resistor 1, the fuse 2 and the MOS transistor 3. Next, at step 408A, the resistance value $R_{cut}$ of this circuit is calculated by $$R_{cut} \leftarrow VF/IM$$

At step 408B, the resistance value $R_{fuse}$ of the fuse 2 is calculated by $$R_{fuse} \leftarrow R_{cut} - R_{uncut}$$

Figure 7A:
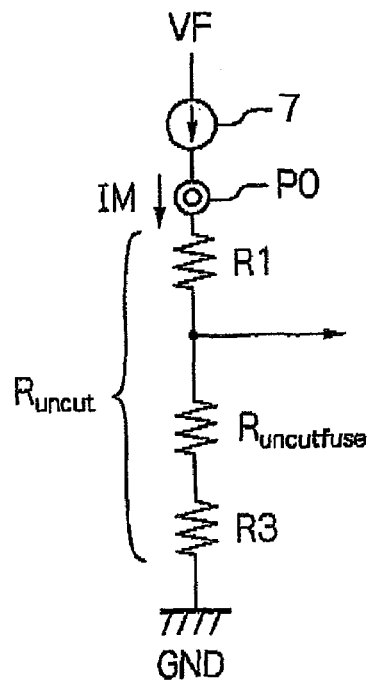
FIGS. 7A and 7B are circuit diagrams for explaining the flowchart of FIGS. 6A and 6B.
Figure 7B:
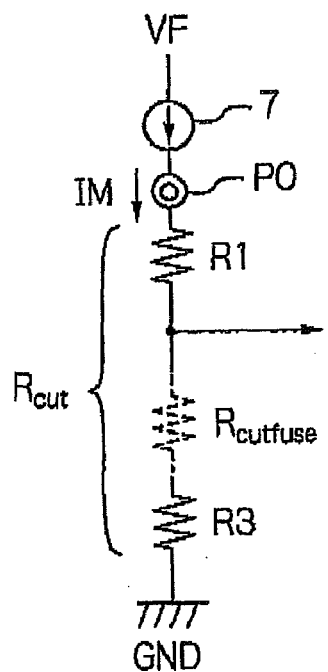

This calculation formula is introduced below. That is, as shown in FIG. 7A, $$R_{uncut} = R1 + R_{uncutfuse} + R3$$

where $R_{uncutfuse}$ is a resistance value of the fuse 2 before it is disconnected. Also, as shown in FIG. 7B, $$R_{cut} = R1 + R_{cutfuse} + R3$$

where $R_{cutfuse}$ is a resistance value of the fuse 2 after it is disconnected. Therefore, the difference $\Delta R$ between $R_{cut}$ and $R_{uncut}$ is calculated by $$\Delta R = R_{cut} - R_{uncut}$$

$$= R_{cutfuse} - R_{uncutfuse}$$

In this case, generally, since $R_{cutfuse} >> R_{uncutfuse}$, $$\Delta R = R_{cutfuse} (= R_{fuse})$$

Therefore, the resistance value $R_{cutfuse}$ or $R_{fuse}$ can be calculated by the above-mentioned formula.

Thus, at step 409, it can be determined whether or not the fuse 2 is in an incomplete disconnection state.

Even in FIG. 6, steps 501 and 502 of FIG. 5 can be provided instead of steps 401, 402 and 403.

Figure 8:
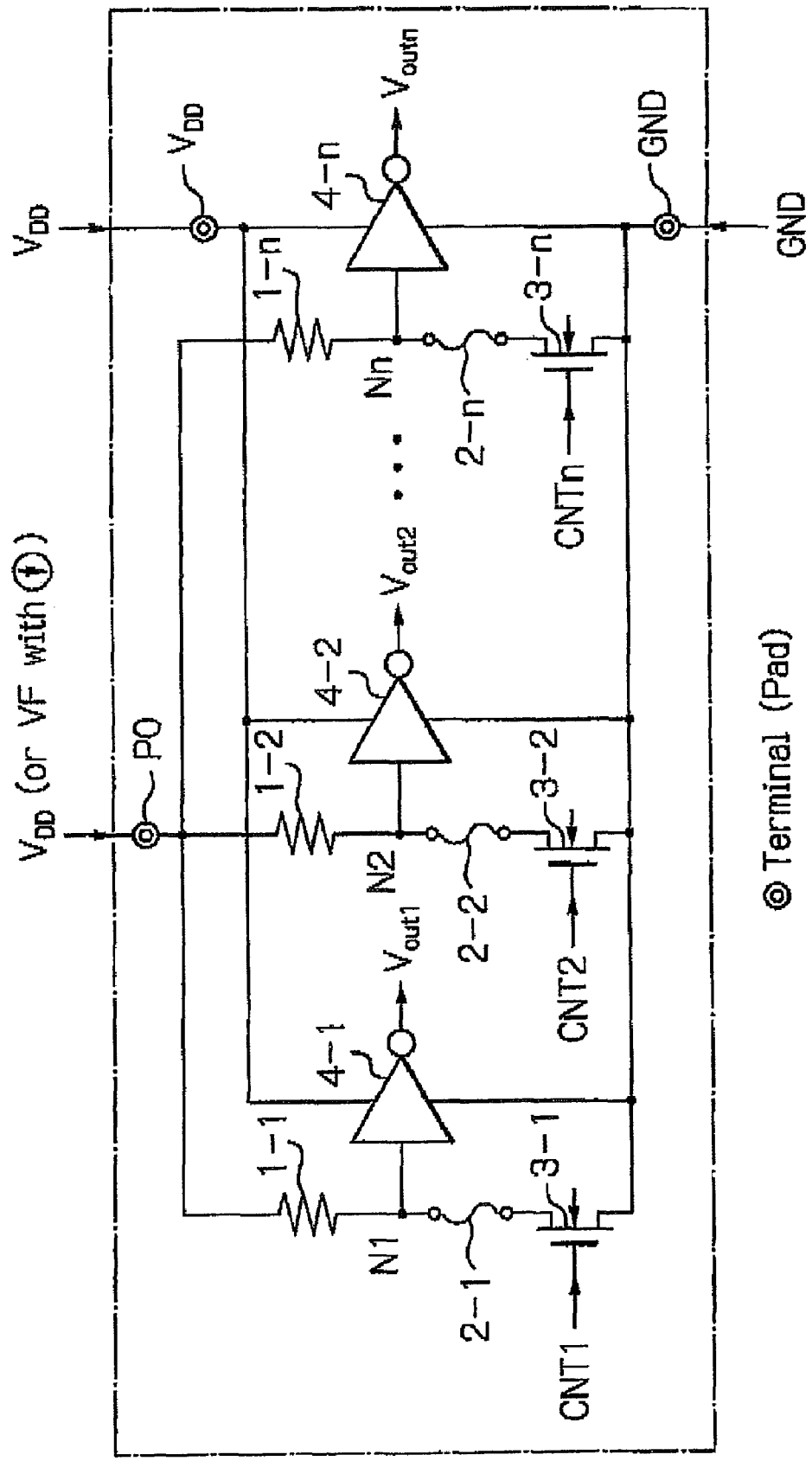
FIG. 8 is a circuit diagram illustrating a second embodiment of the semiconductor device according to the present invention.

In FIG. 8, which illustrates a second embodiment of the semiconductor device according to the present invention, this semiconductor device includes a plurality of trimming detection circuits each of which is constructed by a resistor 1-i and a series arrangement of a fuse 2-i and an n-channel MOS transistor 3-i connected in series between a measuring terminal (pad) PO and a ground terminal (pad) GND, and a determination circuit 4-i formed by an inverter connected to a node Ni between the resistor 1-i and the series arrangement of the fuse 3-i and the n-channel MOS transistor 3-i, to thereby determine whether the fuse 2-i is connected or disconnected, where i is 1, 2, . . . , n. In this case, the inverter of the determination circuit 4-i has a threshold voltage of $V_{DD}/2$.

In FIG. 8, a terminal (pad), a fuse and a pull-up resistor (not shown) the same as the address terminal AO, the fuse 5 and the pull-up resistor 6 of FIGS. 3A and 3B are connected to each gate of the MOS transistors 3-1, 3-2, . . . , 3-n.

In a normal mode, the power supply voltage $V_{DD}$ is applied to the measuring terminal (pad) PO, and control signals CNT1, CNT2, ..., CNTn applied to the gates of the MOS transistor 3-1, 3-2, ..., 3-n are high, so that the fuses 2-1, 2-2, ..., 2-n are connected to the ground terminal GND. Therefore, if the fuse 2-i is in a connection state, the voltage at the node Ni is GND, so that the output $V_{outi}$ of the determination circuit 4-i is "1" (high level). Also, if the fuse 2-i is in a complete disconnection state, the voltage at the node Ni is $V_{DD}$, so that the output $V_{outi}$ of the determination circuit 4-i is "0" (low level).

On the other hand, in a test mode, only one of the control signal CNT1, CNT2, ..., CNTn applied to the gate of the MOS transistor 1-1, 1-2, ..., 1-n is high; however, in this case, a current detector of a tester always with a test voltage VF is connected to the measuring terminal PO.

A first example of method for testing the semiconductor device of FIG. 8 is explained next with reference to FIG. 9.

Here, assume that a current detector of a tester is connected to the measuring terminal (pad) PO, and a test voltage VF is applied thereto. Also, necessary probes of the tester are applied to the semiconductor device of FIG. 8.

Figure 9:
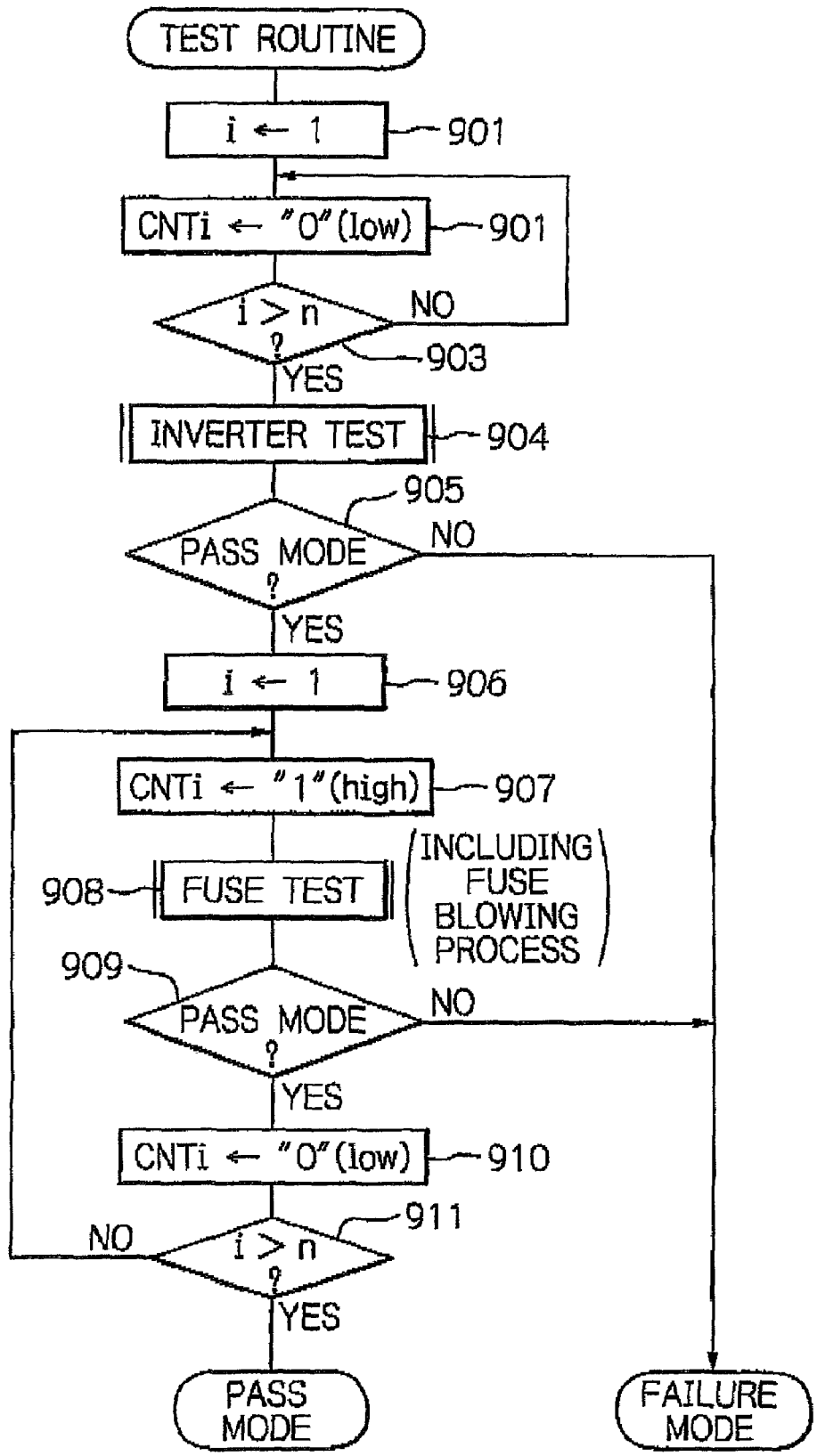
FIGS. 9 and 10 are flowcharts for testing the semiconductor device of FIG. 8.

In FIG. 9, steps 901 to 905 perform an inverter test upon the determination circuits (inverters) 4-1, 4-2, ..., 4-n, while steps 906 to 911 perform a fuse test upon the fuses 2-1, 2-2, ..., 2-n.

First, at step 901, a value "i" is initialized at 1. Then, at step 902, the control signal CNTi is made "0" (low level), and the control at step 902 is repeated by step 903 until the value "i" reaches n. Thus, all the control signals CNT1, CNT2, ..., CNTn are made "0" (low level), so that all the MOS transistors 3-1, 3-2, ..., 3-n are turned OFF.

Next, at step 904, the tester performs an inverter test upon the determination circuits (inverters) 4-1, 4-2, ..., 4-n. For example, the same operation as in steps 402 and 403 of FIG. 4 are carried out. As a result, only when at least one of the determination circuits (inverters) 4-1, 4-2, ..., 4-n has an abnormal threshold voltage, does the control proceed via step 905 to a failure mode. Otherwise, all the determination circuits (inverters) 4-1, 4-2, ..., 4-n have normal threshold voltages, so that the control proceeds to step 906.

At step 906, the value "i" is again initialized at 1.

Next, at step 907, the control signal CNTi is made "1" (high) to turn ON the MOS transistor 3-i. Note that the other MOS transistors are being turned OFF.

Next, at step 908, the tester performs a fuse test upon the fuse 2-i. In this case, the same operation as in steps 408 to 411 of FIG. 4 or steps 602, 603 and 404 to 411 of FIG. 6 is carried out. Only when the fuse 2-i is deemed to be in an incomplete disconnection state, does the control proceed via step 909 to the failure mode. Otherwise, the fuse 2-i is in a connection state or in a complete disconnection state, so that the control proceeds to step 910 which returns the control signal CNTi to "0" (low level).

Steps 907 to 910 are repeated by step 911 until the value "i" reaches n. Only when all the fuses 2-1, 2-2, ..., 2-n are in a connection state or in a complete disconnection state, does the control proceed to a pass mode.

Figure 10:
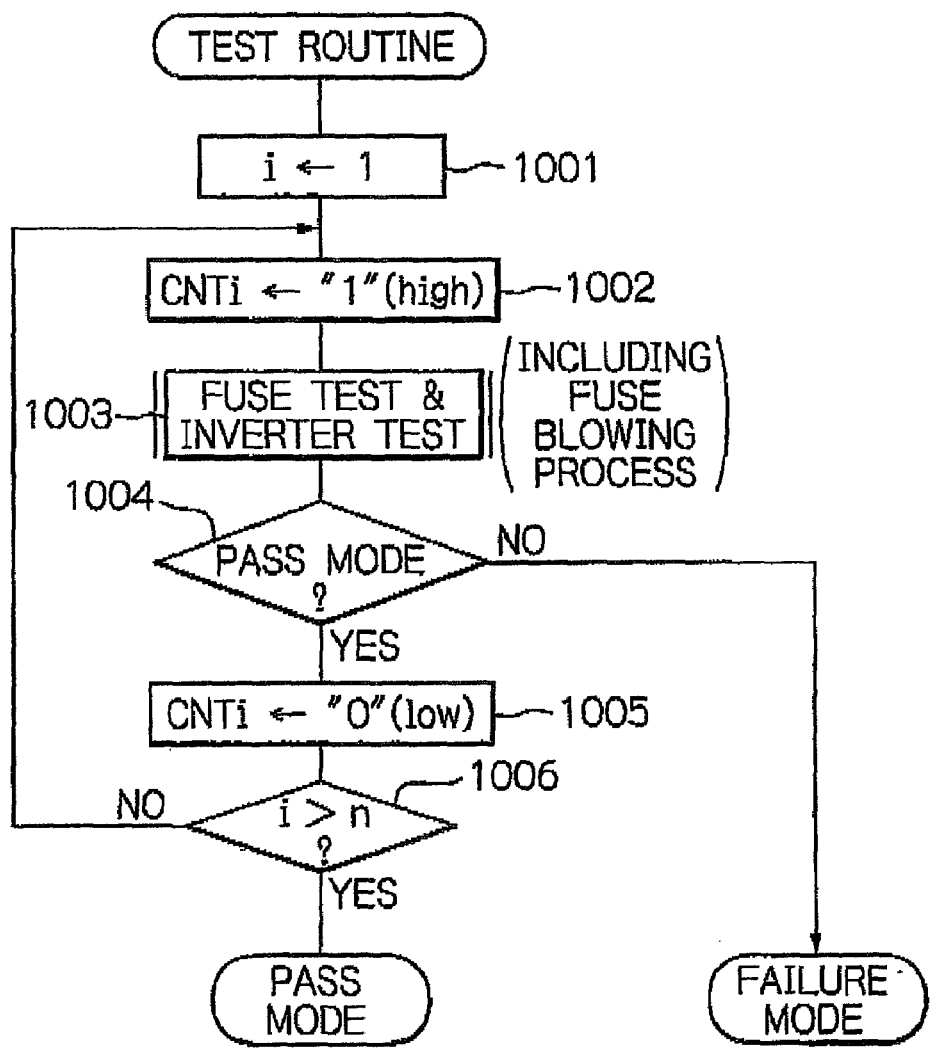

A second example of method for testing the semiconductor device of FIG. 8 is explained next with reference to FIG. 10.

Again, assume that a current detector of a tester is connected to the measuring terminal (pad) PO, and a test voltage VF is applied thereto. Also, necessary probes of the tester are applied to the semiconductor device of FIG. 8.

First at step 1001, the value "i" is initialized at 1.

Next, at step 1002, the control signal CNTi is made "1" (high level) to turn ON the MOS transistor 3-i. Note that the other MOS transistors are turned OFF.

Next, at step 1003, the tester performs a fuse test upon the fuse 2-i and also, performs an inverter test upon the determination circuit (inverter) 4-i. In this case, the same operation as in steps 404 to 411, and 501 and 502 of FIG. 5 is carried out. When the fuse 2-i is deemed to be in an incomplete disconnection state, or when the determination circuit (inverter) 4-i is deemed to be abnormal, the control proceeds via step 1004 to a failure mode. Otherwise, i.e., when the fuse 2-i is in a connection state or in a complete disconnection state and the determination circuit (inverter) 4-i is normal, the control proceeds to step 1005 which returns the control signal CNTi to "0" (low level).

Steps 1002 to 1005 are repeated by step 1006 until the value "i" reaches n. Only when all the fuses 2-1, 2-2, ..., 2-n are in a connection state or in a complete disconnection state and all the determination circuit (inverters) are normal, does the control proceed to a pass mode.

Figure 11:
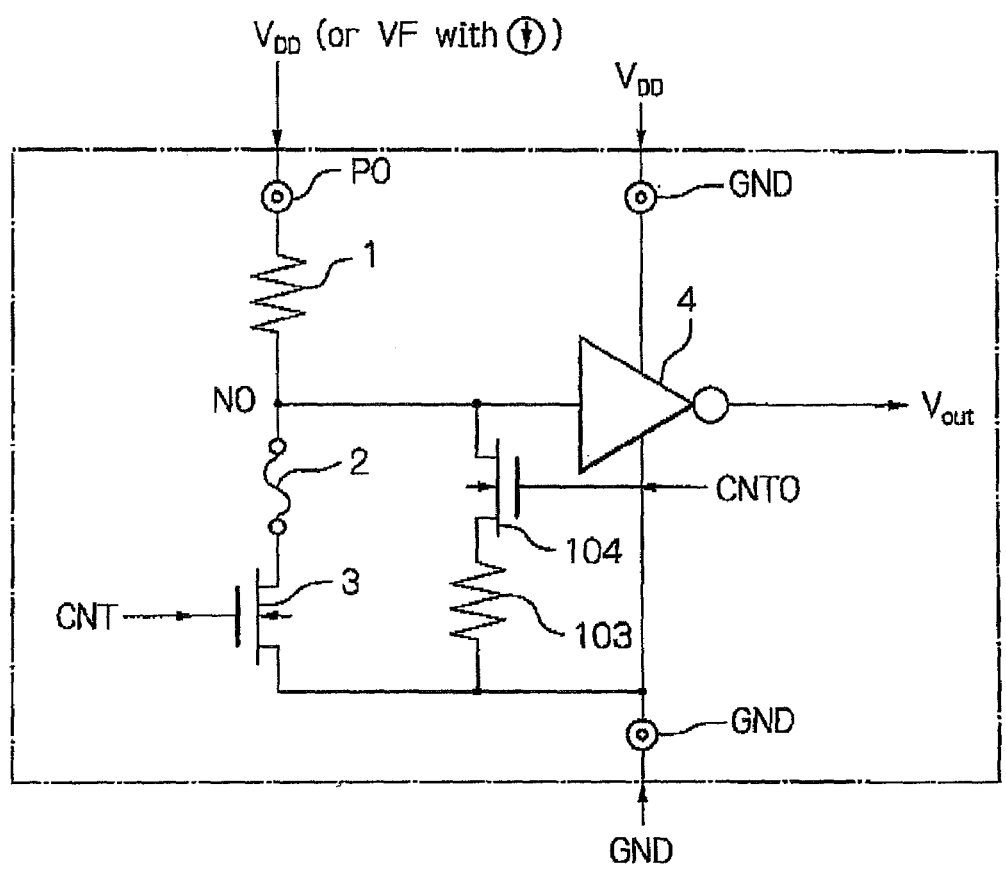
FIG. 11 is a circuit diagram illustrating a third embodiment of the semiconductor device according to the present invention.

In FIG. 11, which illustrates a third embodiment of the semiconductor device according to the present invention, a series arrangement of the testing resistor 103 and the n-channel MOS transistor 4 of FIG. 1 is connected between the node N0 and the ground terminal GND of FIG. 2.

In a normal mode, the power supply voltage $V_{DD}$ is applied to the measuring terminal (pad) PO, and the control signal CNT applied to the gate of the MOS transistor 3 is high and the control signal CNT0 applied to the gate of the MOS transistor 104 is low, so that the fuse 2 is connected to the ground terminal GND. Therefore, if the fuse 2 is in a connection state, the voltage at the node N1 is GND, so that the output $V_{out}$ of the determination circuit 4 is "1" (high level). Also, if the fuse 2 is in a complete disconnection state, the voltage at the node N1 is $V_{DD}$, so that the output $V_{out}$ of the determination circuit 4 is "0" (low level).

On the other hand, in a test mode, the control signal CNT applied to the gate of the MOS transistor 1 is high while the control signal applied to the gate of the MOS transistor 104 is low. Also, a current detector of a tester always with a test voltage VF is connected to the measuring terminal PO. In this case, whether the determination circuit (inverter) 4 is normal or abnormal and whether or not the fuse 3 is in an incomplete disconnection state can be determined in the same way as in the above-described first embodiment.

Also, in another test mode, the power supply voltage $V_{DD}$ is applied to the measuring terminal (pad) PO, and the control signal CNT applied to the gate of the MOS transistor 1 is low while the control signal applied to the gate of the MOS transistor 104 is high. In this case, whether or not the fuse 3 is in an incomplete disconnection state can be determined in the same way as in the above-described prior art.

Note that the third embodiment of FIG. 11 can also be combined with the second embodiment of FIG. 8.

Figure 12A:
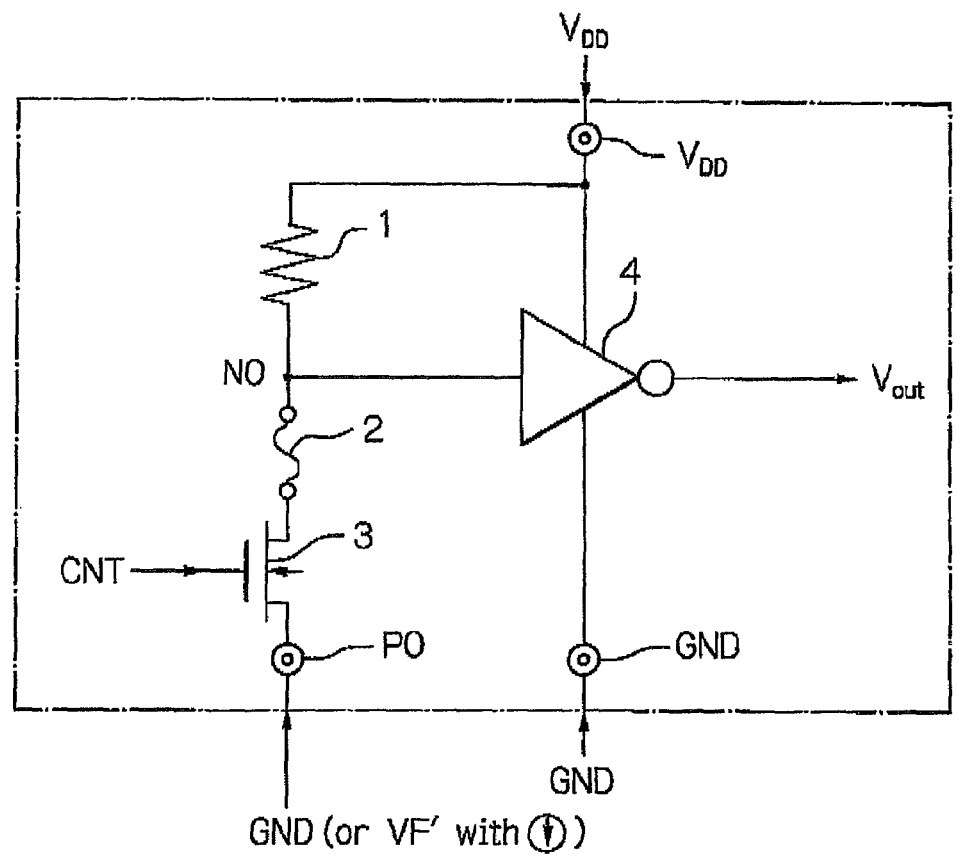
FIGS. 12A, 12B and 12C are circuit diagrams of modifications of the semiconductor device of FIG. 2.

In the above-described embodiments, the measuring terminal (pad) PO is provided on the side of the power supply voltage $V_{DD}$; however, the measuring terminal (pad) PO can be provided on the side of the ground voltage GND, as illustrated in FIG. 12A which is a modification of the device of FIG. 2.

Figure 12B:
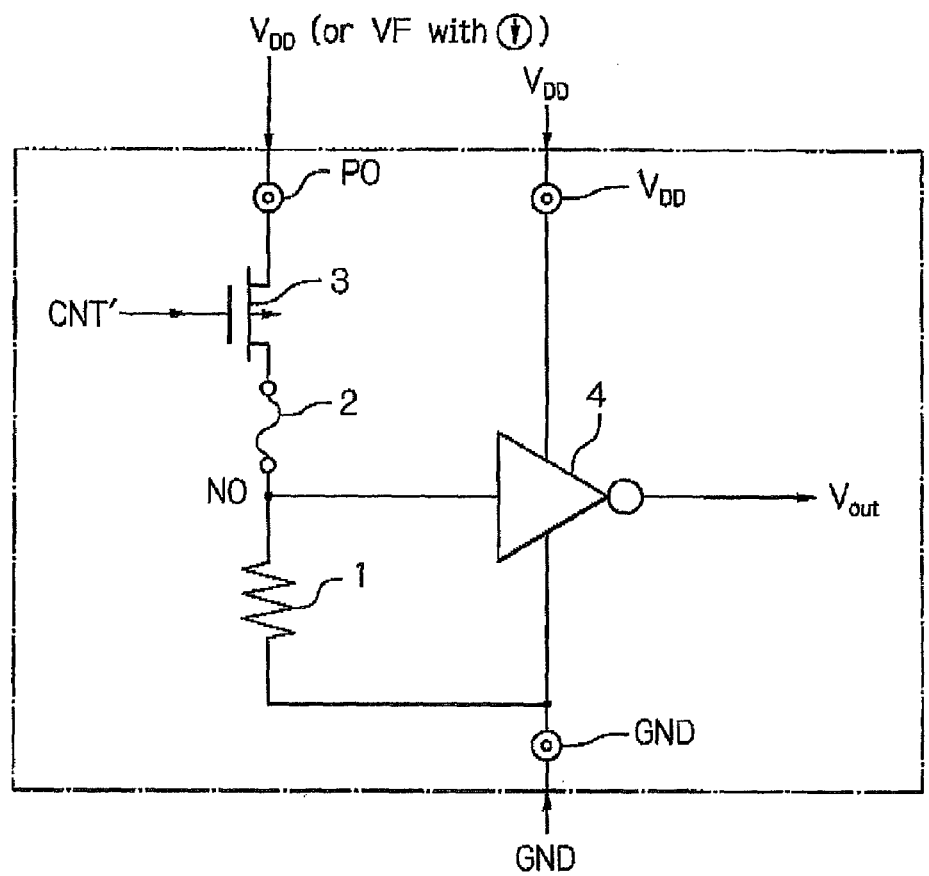
Figure 12C:
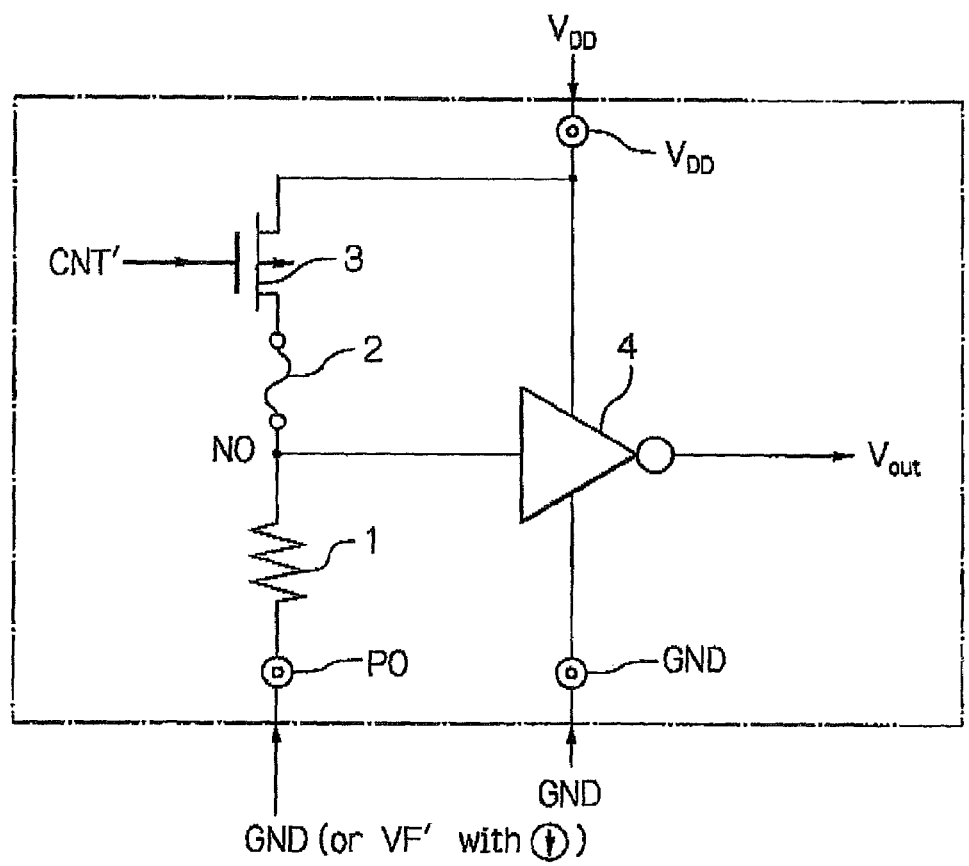

Also, in the above-described embodiments, the resistor such as 1 is provided on the side of the power supply voltage $V_{DD}$ and the series of the fuse such as 2 and the MOS transistor such as 3 is provided on the side of the ground voltage GND; however, the series of the fuse such as 2 and the MOS transistor such as 3 can be provided on the side of the power supply voltage $V_{DD}$ and the resistor such as 1 can be provided on the side of the ground voltage GND, as illustrated in FIGS. 12B and 12C which are modifications of the semiconductor devices of FIG. 2 and 12A, respectively.

Further, in the above-described embodiments, the MOS transistor 3 can be replaced by a p-channel MOS transistor or another switching element. Note that the transistor 3 of FIGS. 12B and 12C is a p-channel MOS transistor controlled by an inverted signal CNT' of the control signal CNT. In this case, the pull-up resistor 6 is replaced by a pull-down resistor.

Still further, in the above-described embodiments, the resistor such as 1 can be replaced by another current supplying element such as a semiconductor diode.

According to the present invention, since the resistance value of a fuse is detected, the incomplete connection state of such a fuse can be surely detected.

The invention claimed is:

1. A test method of a combination comprising an electric circuit capable of realizing a predetermined function, a trimming detection circuit including a fuse to set said function in response to a connection state of said fuse, and a detector separate form said trimming detection circuit to determine said connection state of said fuse without setting said function of said electric circuit, wherein said trimming detection circuit further includes a resistor and a switch element, said resistor being connected to said fuse in series and said fuse being connected to said switch element in series, and said detector includes a current supplying element supplying a current to said trimming detection circuit, the method comprising:
   determining the connection state of said fuse by calculating a resistance value of said fuse.

2. The test method according to claim 1, wherein said resistance value of said fuse is calculated by a difference of a first resistance value and a second resistance value, said first resistance value being the resistance value of the current supplying element supplying a current for the test, said second resistance value being the sum of resistance values of said resistor and said switch element.

3. The test method according to claim 1, wherein said resistance value of said fuse are a first resistance value before said fuse is disconnected and a second resistance value after said fuse is disconnected.

4. The test method according to claim 3, wherein said connection state of said fuse is determined by a difference of said first resistance value and said second resistance value.

5. A combination comprising:
   an electric circuit capable of realizing a predetermined function;
   a trimming detection circuit including a fuse to set said function in response to a connection state of said fuse; and
   a detector separate from said trimming detection circuit to determine said connection state of said fuse without setting said function of said electric circuit, wherein said trimming detection circuit further includes a resistor and a switch element, said resistor being connected to said fuse in series and said fuse being connected to said switch element in series, and
   said detector includes a current supplying element supplying a current to said trimming detection circuit and determines said connection state of said fuse based on a difference of a resistance value of said current supplying element and a sum of resistance values of said resistor and said switch element.

6. The combination according to claim 5, wherein a resistance value of said resistor is given preliminarily.

7. The combination according to claim 5, wherein said switch element is a MOS transistor.

8. A combination comprising:
   an electric circuit capable of realizing a predetermined function;
   a trimming detection circuit setting the predetermined function in response to a connection state of a fuse; and
   a tester, separate from the trimming detection circuit, for supplying a current to the trimming detection circuit to test the connection state of the fuse based on the current, without setting the predetermined function of the electric circuit, wherein the tester comprises a current supplying element for supplying the current.

9. The combination according to claim 8, wherein the trimming detection circuit includes the fuse to set the predetermined function.

10. The combination according to claim 8, wherein the tester tests the connection state of the fuse by calculating a resistance value of the fuse based on the current.

11. A combination comprising:
   an electric circuit capable of realizing a predetermined function;
   a trimming detection circuit comprising a fuse to set the predetermined function in response to a connection state of the fuse; and
   a tester, separate from the trimming detection circuit, for testing a resistance value of the fuse,
   wherein the trimming detection circuit further comprises a resistor connected to the fuse in series and a switch element connected to the fuse in series, and wherein the tester controls the switch so that a current flows through the switch when the tester tests the resistance value.

12. The combination according to claim 11, wherein the tester tests the resistance value based on a voltage and an electric current supplied to the trimming detection circuit.

* * * * *